United States Patent [19]

Davidov et al.

[11] Patent Number: 6,100,703

[45] Date of Patent: Aug. 8, 2000

[54] POLARIZATION-SENSITIVE NEAR-FIELD MICROWAVE MICROSCOPE

[75] Inventors: Dan Davidov, Jerusalem; Michael Golosovsky, Ma'ale Adumim, both of Israel

[73] Assignee: Yissum Research Development Company of the University of Jerusalum, Israel

[21] Appl. No.: 09/111,453

[22] Filed: Jul. 8, 1998

[51] Int. Cl.[7] .................................................. G01R 27/04
[52] U.S. Cl. .......................... 324/631; 324/632; 324/633; 333/21 A
[58] Field of Search .......................... 333/21 A; 324/631, 324/632, 644, 646

[56] References Cited

U.S. PATENT DOCUMENTS

| | | | |
|---|---|---|---|
| 3,093,825 | 6/1963 | Allen | 324/631 |
| 3,697,898 | 10/1972 | Blachier | 333/21 A |
| 4,344,030 | 8/1982 | Anderson | 324/631 |
| 4,500,835 | 2/1985 | Heikkila | 324/631 |

OTHER PUBLICATIONS

Mittleman, et al. "Noncontact semiconductor wafer characterization with the terahertz Hall effect" *Applied Physics Letters*, vol. 71 (1), Jul. 7, 1997, pp. 16–18.

C. Druon et al. "Novel microwave device nondestructive electrical characterization of semiconduction layers", *Review Scientific Instruments*, vol. 61 (11), Nov. 1990, pp. 3431–3434.

*Primary Examiner*—Safet Metjahic
*Assistant Examiner*—Jose M. Solis
*Attorney, Agent, or Firm*—Charles S. Guenzer

[57] ABSTRACT

A microwave microscope for measuring electrical characteristics of a sample, such as a semiconductor wafer, with fine resolution. A probe includes a microwave waveguide capable of supporting the two lowest orthogonal modes from a microwave source, e.g. of millimeter radiation. The probe tip includes a thin conductive wall formed at the probe end of the probe. Two perpendicularly arranged slits, that is cross slits, are formed in the conductive wall, each slit having a length nearly resonant with the microwave radiation and a width substantially smaller, e.g. of the order of 100 $\mu$m, and of a size such that the radiation of the proper polarization nearly transparently passes through that slit. The sample to be tested is placed in the near field of the probe tip and scanned relative to the probe. Probing microwave radiation having the polarization which passes through one slit is launched in the waveguide. A non-rotated polarization component is reflected back from the sample through the same slit. A rotated polarization component is reflected back through the other slit. Microwave techniques are used to separately measure the two components and, if desired, their magnitudes and phases. The rotated component is particularly useful for mapping Hall mobilities, anisotropies, and local non-uniformities.

20 Claims, 5 Drawing Sheets

POLARIZATION-SENSITIVE NEAR-FIELD MICROWAVE MICROSCOPE

FIELD OF THE INVENTION

The invention relates generally to electrical measuring equipment and methods. In particular, the invention relates to microwave equipment and methods for mapping two electrical characteristics differentiated by polarization, over a surface with a resolution of a few micrometers.

BACKGROUND OF THE INVENTION

It is often desired to map electrical properties over a surface of a body and to do so with fine resolution. The microelectronics industry uses semiconducting substrates (wafers) based on silicon, gallium arsenide, and other semiconductors and conducting layers deposited on these substrates. It is required that the uniformity of these substrates and layers be tightly controlled in order to achieve an acceptable yield of integrated circuits over a large wafer or substrate.

It is common to map the resistivity of a wafer in order to monitor wafer uniformity, both before processing and after ion implantation, layer growth, or deposition of conducting layers. The mapping may have the resolution of a few millimeters or even centimeters if only gradual variations across the wafer are anticipated. However, for some effects it is desired to have a technique that is more sensitive to electrical effects of smaller non-uniformities and defects rather than to smooth variations across the wafer. Probes of millimeter resolution are available that rely upon eddy-currents. Examples of such probes are gradient probes and differential probes, but in these examples their resolution lies above 1 mm.

In some applications, such as in the semiconductor fabrication industry, it is often desirable to control not only the resistivity, which is the product the carrier density and the mobility, but to separately control both of these parameters. Several contactless methods have been developed to make such concurrent measurements, for example: (1) microwave photoconductivity, in which the resistivity is measured through microwave reflection and the carrier density is varied by the level of optical illumination; and (2) Hall effect, measured by DC techniques in which a DC magnetic field is applied to the sample and the resultant magnetically induced voltage transverse to the applied voltage is measured.

Several methods have been proposed for mapping mobility and carrier density.

As Mittleman et al. has described in "Noncontact semiconductor wafer characterization with the terahertz Hall effect," *Applied Physics Letters*, vol. 71, no. 1, July 1997, pp. 16–18, one technique focuses a beam of terahertz radiation on a GaAs wafer and relies upon Faraday rotation to measure the mobility and carrier density. In Faraday rotation, the application of a magnetic field causes the polarization plane of the electromagnetic field to rotate. The effect can be considered in the context of transmission and reflection of electromagnetic waves from conductors to be a high-frequency Hall effect. The method is powerful, but its spatial resolution is diffraction limited and is presently about 250μm.

Another technique has been described by Druon et al. in "Novel microwave device for nondestructive electrical characterization of semiconducting layers," *Review of Scientific Instruments*, vol. 61, 1990, pp. 3431–3434. This technique supplies 1GHz microwaves to two planar microstrip resonators scanned across the sample. The two resonators are perpendicularly arranged in a cross configuration. In the absence of a magnetic field, the two resonators are decoupled, but a magnetic field couples them through the Hall effect in the semiconductor sample. The technique can map mobility and carrier density with a resolution of several millimeters.

Another technique relies on an open microwave waveguide probe irradiating the sample. In the reflection mode, the same waveguide propagates the reflected radiation back to the detector. If the waveguide can support two orthogonal modes (for example, a circular waveguide), the rotated reflected component can be detected.

In the transmission mode, the receiving rectangular waveguide is rotated 90° from the probing rectangular waveguide to pick up only the rotated transmitted component. For such probes, the resolution is limited to the dimensions of the waveguide, about $\lambda/2 \times \lambda/2$, that is, no better than 1 mm×1 mm.

In U.S. patent application Ser. No. 08/526,659, filed Sep. 11, 1995 now issued as U.S. Pat. No. 5,701,018 and published as PCT Published Application WO 97/10514, incorporated herein by reference in its entirety, we have disclosed a microwave microscope that addresses at least some of these problems. It includes a microwave probe 10 illustrated isometrically in FIG. 1. A rectangular microwave waveguide 12 includes two side walls 14 of width a and two narrow side walls 16 of width b, all of which are highly conductive so as to support microwaves within the rectangular volume defined by the side walls 14, 16. The lateral wall dimensions are chosen to support microwaves within a predetermined frequency or wavelength band. For a given microwave wavelength $\lambda_0$, there is a set of minimum dimensions lower than which the microwave radiation is not supported by the waveguide, and, as a result, the radiation quickly attenuates within the waveguide. There are no maximum dimensions, but the microwave radiation propagates with excessive loss when the waveguide size a, b is substantially larger than the microwave wavelength $\lambda$. A circular or other cross-sectional waveguide will also propagate microwaves and thus be usable with the described probe.

A conductive foil end wall or faceplate 18 is joined to the waveguide 12 at its probe end and includes a located slit aperture 20 having a long dimension a' along the long waveguide side 14 and a short dimension b' along the short waveguide side 16. We now observe that the aperture need not be centrally located and that the slit need not be precisely parallel to the sidewalls of the waveguide 12 as long as its length is increased approximately by the arccosine of the angle. Instead of the conductive foil, a fairly thick dielectric wall can be used on which is coated a thin conductive coating.

The conductive coating may be deposited on either side of the dielectric wall 18 and electrically connected to the waveguide 12, and the aperture 20 may be formed in the conductive coating by chemical etching or laser ablation.

The dimensions a, b of the waveguide 14 are chosen to efficiently propagate microwave radiation of wavelength $\lambda$, as is well known in the technology of microwave waveguide transmission. It is further known that such an end wall with a narrow slit is transparent to microwave radiation if the dimensions are chosen such that $$\frac{a}{b}\sqrt{1-\left(\frac{\lambda}{2a}\right)^2} = \frac{a'}{b'}\sqrt{1-\left(\frac{\lambda}{2a'}\right)^2}. \quad (1)$$

That is, under these conditions, the probe end efficiently propagates the probing radiation, but the near-field radiation field has a width (resolution) of the order of b' thereby providing microscopic resolution in the direction of the slit width b'. Generally the long slit length a' may be made slightly larger than the half microwave wavelength λ/2. An exemplary slit width b' that can be reliably machined is 100 μm and is 10 μm for vacuum deposited features, both appropriate for 80 GHz microwaves.

An example of a reflection-mode microwave microscope 30 using such a microwave probe 10 is illustrated schematically in FIG. 2. The slit 20 is cut into 20 μm-thick aluminum foil, has dimensions of 1.5 mm by 100 μm, and transmits at 80 GHz. The tested material 32, for example, a semiconductor wafer, is mounted on a movable X–Y stage 34 through an intermediate thick glass plate 36. It is alternatively possible to provide relative lateral movement between the slit 20 and the sample 32 by moving the waveguide 12. The slit 20 of the probe 10 is positioned to within a few micrometers from the front surface 37 of the wafer 32.

A source 38 of millimeter wave microwave radiation, for example at 80 GHz in E-band, provides the probing microwaves. An E-band millimeter-wave bridge is formed of a hybrid tee 40, an adjustable attenuator 42, a sliding short 44, and an E–H tuner 46 that matches the impedance of the slit antenna to that of the waveguide. A microwave detector 48 receives radiation from the bridge to thereby measure its imbalance, and the intensity is transmitted to a computer 50, which is also controlling a driver 52 scanning the X–Y stage 34 in a 2-dimensional scan. To increase sensitivity, a signal generator modulates the amplitude of the millimeter-wave source 38 and serves as a synchronizing signal for a lock-in amplifier receiving the output of the detector 48. The sensitivity can be further increased and the phase of the radiation can be measured by shifting the operating point of the detector 48 by varying the attenuator 42 and the sliding short 44.

The computer 50 outputs the detector signal registered with the X–Y position of the wafer 32. If the bias signal is in phase with the reflected signal, the detector voltage is sensitive to variations of the amplitude of the reflected signal, but, if the phase of the bias signal is in quadrature with the reflected signal, then the detector voltage is sensitive to phase variations. The amplitude gives information about the resistivity while the phase yields information about the dielectric constant.

Although the microwave microscope described above is effective at mapping the resistivity or dielectric constant, it is fundamentally a one-dimensional probe, i.e. along the narrow slit dimension b' although the lateral resolution can be improved by curving the slit in the length direction a The electrical polarization is restrained to be parallel to the short slit length both on incidence and on reflection. The probe 10 is relatively insensitive to polarization effects and to crystallographic anisotropies in the probed material. In particular, it cannot measure Hall mobilities, especially in conjunction with measuring resistivities.

It is desired to obtain such a microwave microscope that can measure polarization effects and anisotropies.

All these techniques also are directed to the measurement of characteristics varying spatially fairly slowly and are relatively insensitive to non-uniformities and defects which are substantially smaller than the short dimension of the slit. For example, the discontinuity presented by a grain of foreign material in a background matrix can be detected only if the electrical characteristic of the foreign grain is distinguishable from that of the background material.

It is further desired to obtain a microwave microscope that is more sensitive to very small though strong defects.

SUMMARY OF THE INVENTION

The invention may be summarized as a microwave microscope having a probe comprising a microwave waveguide with a conductive end wall at the tip. Two slits are formed in the end wall at an oblique angle to each other, preferably in the configuration of perpendicularly crossing slits. Each slit has a length that is approximately resonant with the microwave radiation and a width that is substantially smaller but of a size to make the slitted end wall nearly transparent to the radiation. Preferably, the probing microwave radiation is launched in the probe with a single polarization and passes through a first one of the slits aligned for that radiation to test a sample disposed in the near radiation field from the slit. Microwave radiation reflected from the sample may have a first component of the original polarization, which passes back through the first slit, and a second or rotated component, which is perpendicular to the original polarization and passes back through the second slit. Suitable microwave circuitry can measure both reflected components, thereby allowing the mapping of electrical characteristics of anisotropic materials, or of both the resistivity and Hall mobility. Also, the rotated component is sensitive to local gradients of generally isotropic properties.

DETAILED DESCRIPTION OF THE PREFERRED EMBODIMENTS

Figure 3:
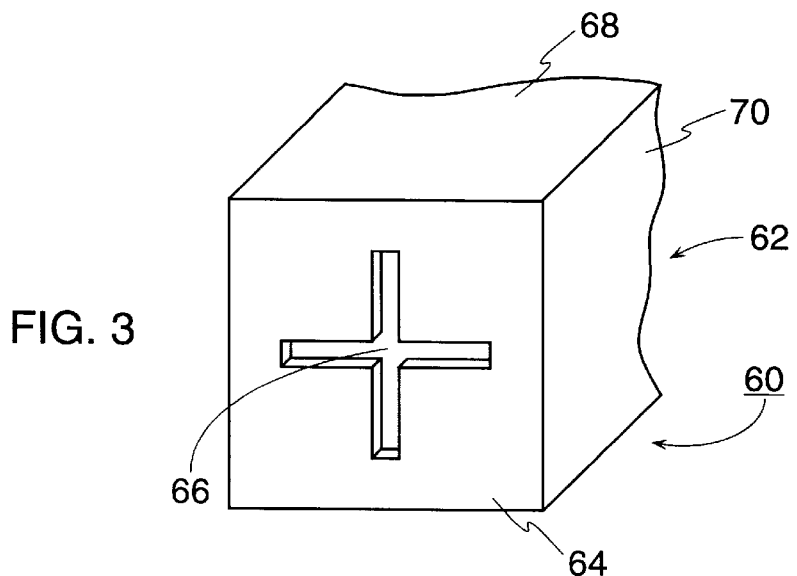
FIG. 3 is an isometric view of a cross-slit microwave probe tip using a square waveguide.
Figure 4:
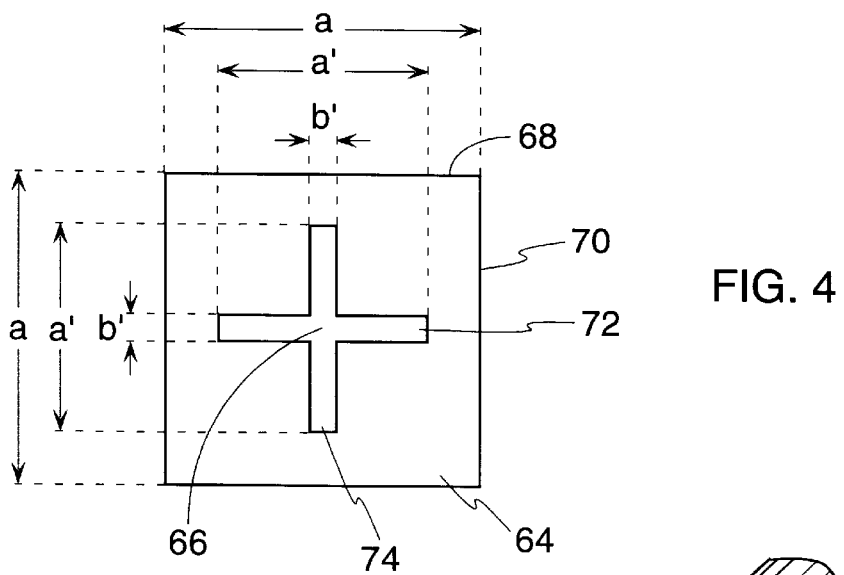
FIG. 4 is an end view of the cross-slit probe of FIG. 3.

One embodiment of a cross-slit probe 60 of the invention is illustrated in isometric view in FIG. 3. In this particular embodiment, a square waveguide 62 has a square end face 64 with a cross-slit aperture 66 formed in an end plate 64. As further illustrated in the axial end view of FIG. 4, orthogonally disposed side walls 68, 70 of the waveguide 62 have equal widths a so that the waveguide 62 can support the two orthogonal fundamental microwave modes $TE_{01}$, $TE_{10}$, which are degenerate and are the two lowest-order modes. Preferbly the width a is chosen so that all higher-order modes with the same polarization are suppressed.

The cross-slit aperture 66 includes two slits 72, 74 arranged perpendicularly to each other and preferably having the same narrow dimension b' and the same long dimension a'. The long dimension a' is approximately equal to the half microwave wavelength $\lambda/2$, assuming no dielectric loading of the waveguide, and the short dimension b' is much smaller and approximately satisfies Equation (1) with a=b. One slit 72 passes one of the fundamental modes while the other slit 74 passes the other, orthogonal fundamental mode.

Figure 5:
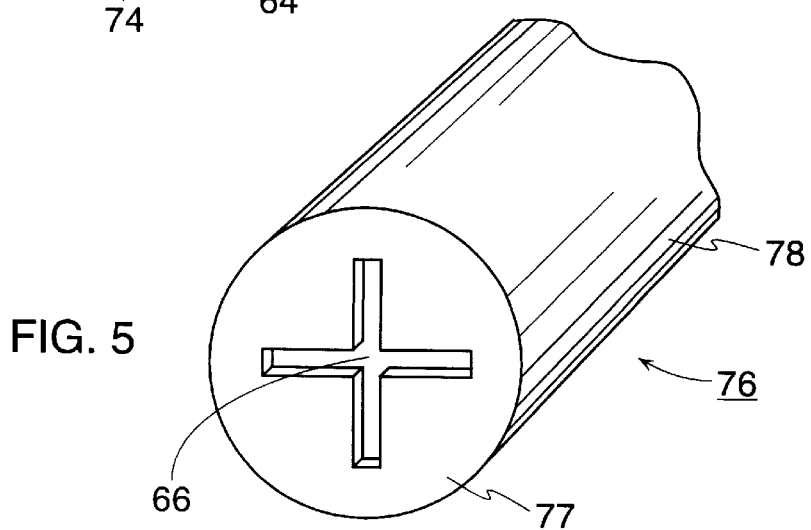
FIG. 5 is an isometric view of a cross-slit microwave probe tip using a circular

A second embodiment of a probe 76, illustrated isometrically in FIG. 5, substitutes a cylindrical waveguide 78 of diameter a' with the cross-slit aperture 66 formed in a circular end plate 77. The condition of Equation (1) needs to be adjusted somewhat for the cylindrical geometry of the waveguide, but the relationships are very much the same. The waveguide diameter a' is chosen such that the two degenerate fundamental modes are supported but the higher-order modes are suppressed.

The simple preferred mode of operation of the cross-slit probes 60, 76 is to launch a probing microwave beam through only one slit 74, here assumed to be extending along the y-direction for sake of definiteness, and to receive reflected components back into the probe from the sample through both slits 72, 74. To achieve unambiguous results in most cases, the incident microwave propagating down the waveguide 62, 78 toward the cross-slit aperture 66 should be polarized in x-direction. Any y-polarized incident beam would create a cross-talk between the reflected components.

Figure 6:
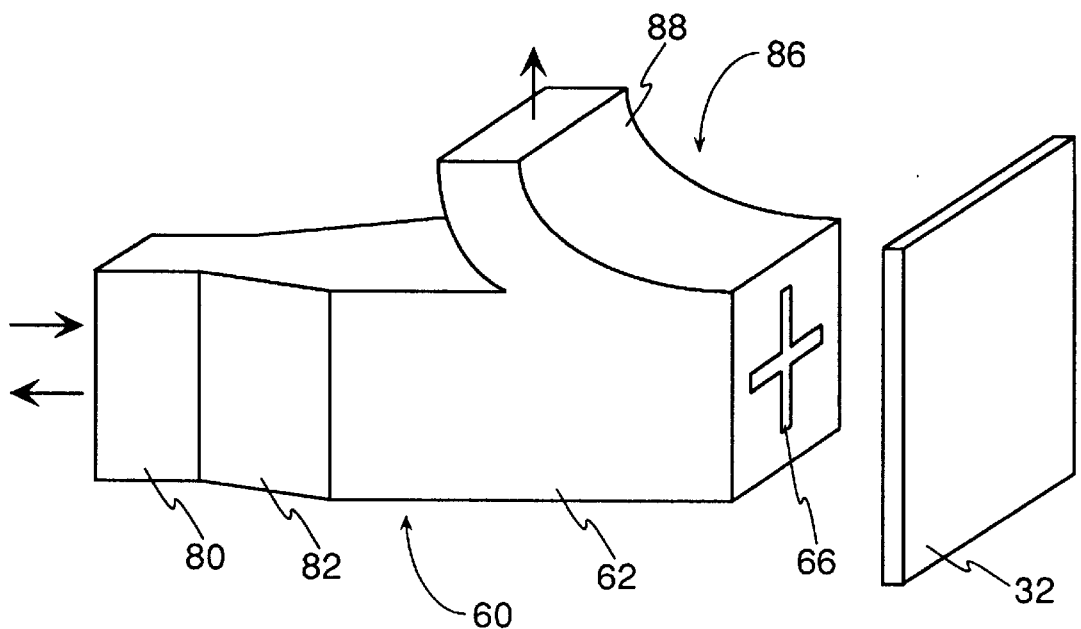
FIG. 6 is an isometric view of a cross-slit microwave probe using the square waveguide of FIG. 3.

One structure to polarize of the incident beam is illustrated isometrically in FIG. 6 for the square waveguide 62 with its cross slits 66 positioned close to the sample 32 being mapped The incident microwave is guided to the probe 60 through a rectangular input/output waveguide 80 having sides a, b sized such that the input/output waveguide 80 supports only the $TE_{10}$ mode with its electrical polarization along the smaller dimension b and does not support the $TE_{01}$ mode with its polarization along the larger dimension a. The larger dimension a extends along the y-direction. As a result, the applied microwave radiation is necessarily polarized in the x-direction. The input/output rectangular waveguide 80 is joined to the square waveguide 62 through a wedge-shaped transition section 82 to provide efficient electromagnetic coupling.

The probing microwave radiation passes through the y-oriented slit 74 and strikes the sample 32. Upon reflection, the non-rotated component passes backwardly through the y-oriented slit 74 while the rotated component passes through the orthogonally arranged x-oriented slit 72. Only the x-polarized reflected component is efficiently coupled back into the rectangular input/output waveguide 80. On one side of square waveguide 62 is arranged a microwave directional coupler 86 consisting of another rectangular output waveguide 88 having the same side dimensions a, b as the input/output waveguide 80 but arranged perpendicularly with respect to the square waveguide 62. Its long dimension a is arranged across the square waveguide 62 on the side corresponding to the short side of the input/output waveguide 80. Thereby, the output waveguide 88 supports only y-polarized radiation, and only y-polarized reflected radiation is efficiently coupled thereto from the square waveguide 62.

Figure 7:
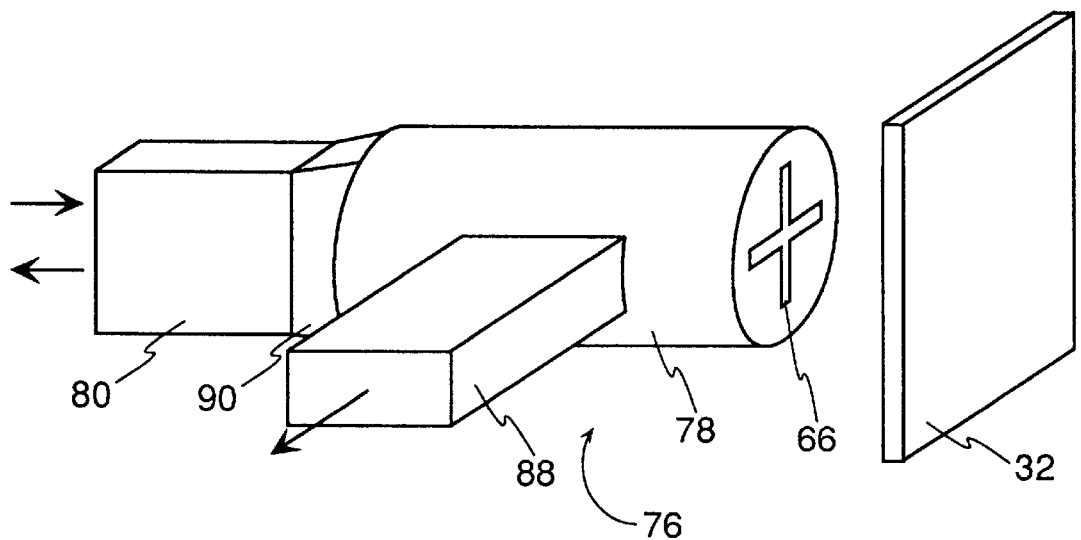
FIG. 7 is an isometric view of a cross-slit microwave probe using the circular waveguide of FIG. 5.

A somewhat equivalent operation is obtained with the orthomode transducer illustrated isometrically in FIG. 7 which uses the circular probe tip 76 of FIG. 5. The major part of this orthomode transducer is commercially available from Millitech Corporation of Southfield, Mass. as model OMT-10. The rectangular input/output waveguide 80 is connected to the end of the circular waveguide 78 through a tapered section 90. It couples x-polarized radiation into the circular waveguide 78 and receives only x-polarized reflected radiation from the circular waveguide 78. The rectangular output waveguide 88 penetrates the side of the circular waveguide 78 with is long dimension a arranged along the axis of the circular waveguide 78 and its short dimension b parallel to the long dimension a of the input/output waveguide 80. As a result, the output waveguide 88 couples microwave radiation out of the circular waveguide 78 that is polarized along the y-direction.

Figure 1:
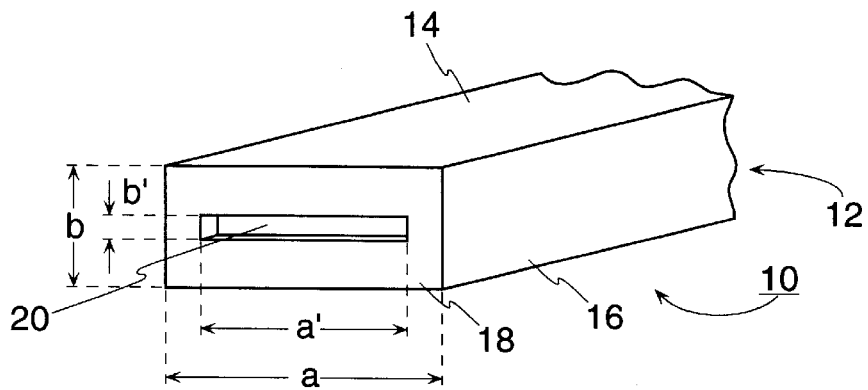
FIG. 1 is an isometric view of a single-slit probe tip for a microwave microscope.
Figure 2:
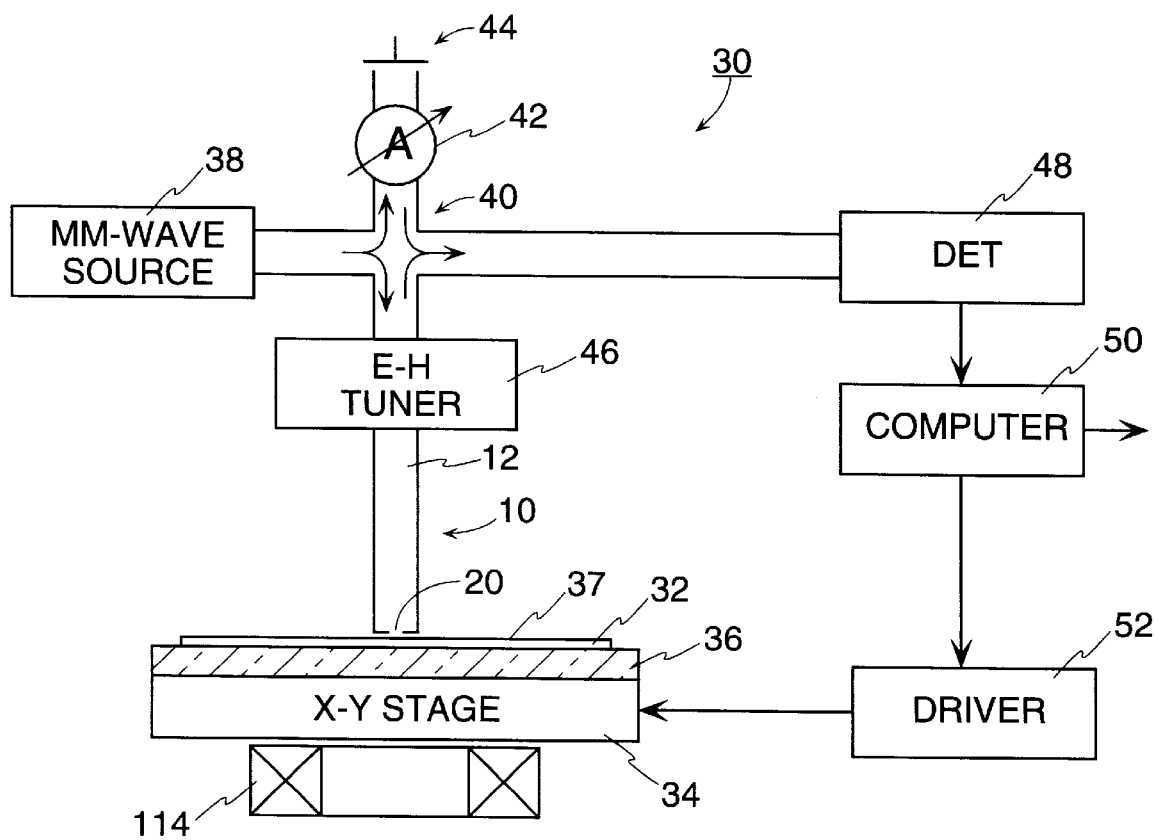
FIG. 2 is a schematic diagram of a microwave microscope using the probe tip of FIG. 1.

The measuring circuitry of FIG. 2 can easily be adapted to the probes of FIGS. 6 and 7. The input/output waveguide 80 is substituted for the waveguide 12, and the illustrated detector 48 measures the non-rotated component along the x-axis of the sample. Another detector and E-H tuner are connected to the output waveguide 88 of FIGS. 6, 7, and its output measuring the rotated component is also supplied to the computer 50.

Figure 8:
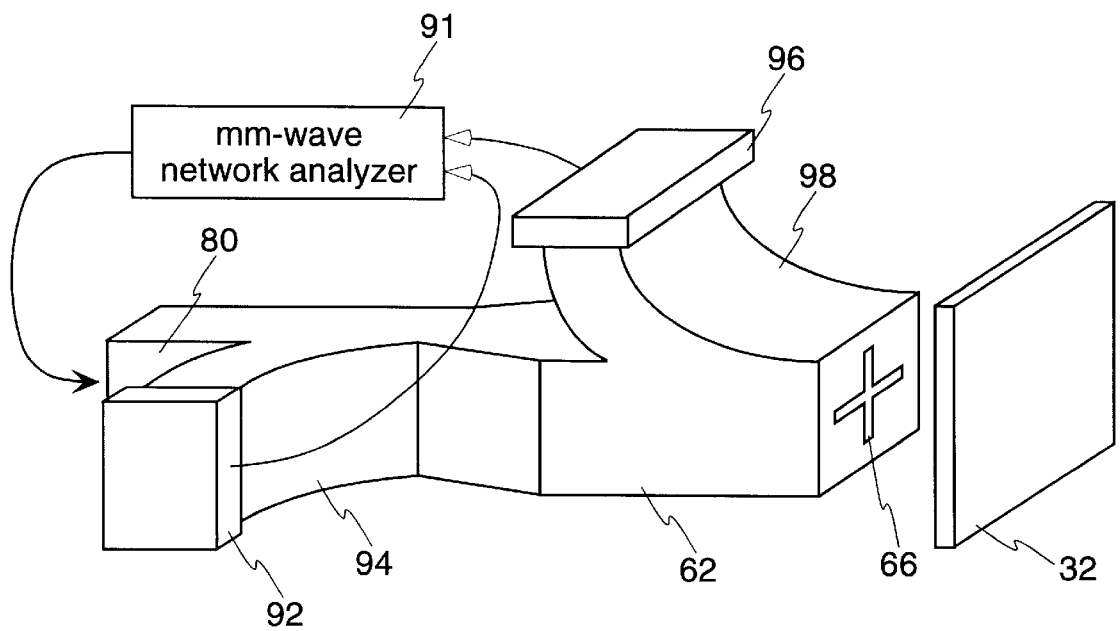
FIG. 8 is a schematic representation of the commercially available microwave circuitry usable with the probe of the invention.

Another measuring technique, as illustrated schematically in FIG. 8, relies upon a commercially available millimeter-wave network analyzer 91, such as the HP 8510C, available from Hewlett-Packard of Palo Alto, Calif. The analyzer 91 provides a source of millimeter microwaves to the input/output waveguide 80. A first detector 92 is electrically coupled to the end of a directional coupler 94 attached to the side of the input/output waveguide 80 to receive the back reflected microwaves of the non-rotated polarization. A second detector 96 is coupled to a directional coupler 98 attached to the side of the square (or circular) waveguide 62 to receive the back reflected microwaves of the rotated polarization. Each of the detectors 92, 96 may be a harmonic mixer, such an HP 11-970W available from Hewlett-Packard.

The electrical outputs of the detectors 92, 96 are connected to the network analyzer 91, which can measure both the magnitude and phase of the reflected waves with reference to the probing wave. The HP 8510C is designed for only a single detector signal, so using this equipment requires alternating the electrical connections from the two detectors 92, 96. A two-wave network analyzer can be substituted.

Figure 9:
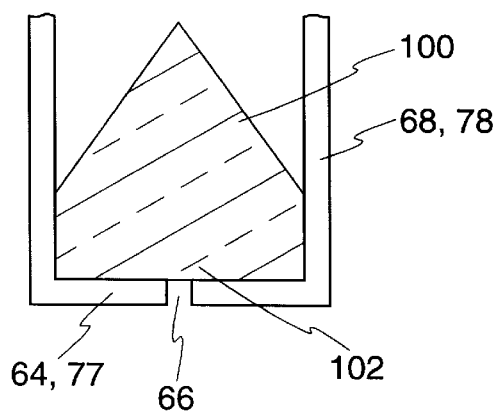
FIG. 9 is an sectioned side view of a dielectrically loaded probe tip.

Several variations and improvements on the probe tip are possible. As illustrated in the cross-sectional view of FIG. 9, the probe tip next to the cross-slit aperture 66 may be loaded with a wedge-shaped or ball-shaped dielectric 100 that has the effect of compressing the microwave wavelength at the probe tip. The bottom of the wedge-shaped dielectric 100 should cover the entire cross-slit aperture 66 and preferably cover the entire backside of the end plate 64, 77. If the waveguide 62 is square, the wedge-shaped dielectric 100 should be in the form of a pyramid with an extended square bottom 102; if the waveguide 78 is circular, the wedge-shaped dielectric 100 should be in the form of a cone with an extend circular bottom 102. The ball-shaped dielectric offers much the same effect since its upstream end is tapered and couples the radiation into the dielectrically loaded portion.

The end plate 64, 77 and associated cross-slit aperture 66 can be curved in one or two directions. As illustrated isometrically in FIG. 10 for a one-dimension curve with a rectangular waveguide 62, one pair of opposed walls 68 are formed with curved ends 104 while the other pair of walls 70 have straight ends. An end plate 106 in the shape of a partial cylinder is fit to the waveguide 62, and the cross-slit aperture 66 is formed in the arc-shaped end plate 66 with the one slit 74 being straight while the other slit 72 is curved. The depth of the arc of the cylinder may be about 50% of the width of the end plate 66 so that the radiation passing through the curved slit 72 is focused in the near field only in the proximity to the intersection with the straight slit 74. The effect is to improve the lateral resolution (decrease its size) along the direction of the curved slit 72. Preferably the curved slit 72 extends along the y-direction (perpendicular to the polarization of the probing radiation) so that the probing radiation is more tightly focused on the sample. The rotated reflected radiation inherently exhibits better resolution since the resolution requires the near overlap of the two intersecting slits 72, 74.

Figure 10:
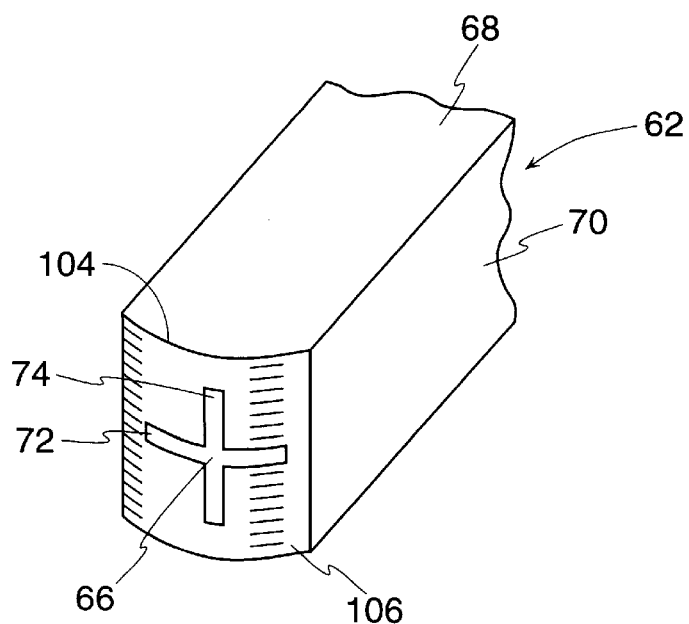
FIG. 10 is an isometric view of a curved probe tip.

The structure of FIG. 10 is structurally advantageous since the end plate 106 is easily formed by cutting the cross slits into a thin conductive foil and then bending the foil over the curved wall ends 104. Nonetheless, with careful fabrication, for example, by coating a conductor on a curved dielectric substrate, more complex curved probe tips can be formed, such as, a cylindrically shaped end plate joined to a circular waveguide or a spherically shaped end plate joined to either a square or a circular waveguide.

The cross-slit probe can be used to map a number of different material characteristics. The material of the sample being probed can be characterized by a surface impedance tensor $$R = \begin{pmatrix} R_{xx} & R_{xy} \\ R_{yx} & R_{yy} \end{pmatrix}. \tag{2}$$

The surface impedance tensor applies to electrically thick samples that are thicker than several skin depths at the frequency of the incident radiation. For electrically thin samples, that is, having a thickness much thinner than the skin depth, the impedance tensor is replaced by the sheet resistance tensor. In the configuration described before where the incident radiation is polarized along the x-direction, the non-rotated reflected component measures $R_{xx}$ and the rotated component measures $R_{xy}$. In an optically active material, the surface impedance can be characterized as $$R = \begin{pmatrix} R_1 & -iR_2 \\ iR_2 & R_1 \end{pmatrix}, \tag{3}$$

where $R_1$ and $R_2$ are real. The imaginary cross term is non-zero either when the sample does not have an inversion symmetry or in the presence of a magnetic field. In the latter case, $$R_2 = \mu_H H, \tag{4}$$

where $\mu_H$ is the Hall mobility and H is the applied magnetic field. Thereby, the electronic mobility can be measured by the rotated component in the presence of an applied magnetic field. A vertical magnetic field can be applied to the sample in the vicinity of the probe tip by the magnetic field means illustrated schematically in FIG. 2 comprising a magnetic coil 114 positioned above or below the sample 32 to produce a generally uniform magnetic field in the vertical direction, either at DC or low-frequency AC. Other magnetic means are available, for example, inductively powered magnetic yokes or permanent magnets.

Because the cross term has an imaginary value for the Hall effect or for optically active materials, the mobility measurement produces a signal having a phase which is in quadrature with the incident radiation.

The surface impedance for a rectangular anisotropic optically inactive material can be represented as $$R = \begin{pmatrix} R_x & 0 \\ 0 & R_y \end{pmatrix}, \tag{5}$$

where the anisotropy axis is aligned along the x-direction. The anisotropy can arise from the material itself or from local features imposed on the surface. For example, a cross-slit disposed between two parallel conductors on a dielectric surface will show different effective resistivity in the two directions. To best take advantage of the dual-polarization measure for anisotropic materials, the sample needs to be rotated so that the anisotropy axis is between the x- and y-directions. When the rotation is applied to the surface impedance of Equation (5), the cross terms become proportional to the difference $R_x - R_y$.

A somewhat similar result is obtained when the material is locally isotropic but there is a strong gradient of resistivity $\nabla \cdot R$ or other electrical characteristics. In this case, the cross term $R_{xy}$ that is measured by the rotated component is proportional to $\Delta R \cdot \sin\phi$, where $\nabla R$ is the change of R across the active area of the slit along the x-direction and $\phi$ is the angle between the gradient and the x-direction. This technique allows the measurement of a fairly small change in resistivity or other characteristics if that change occurs over a small distance.

Figure 11:
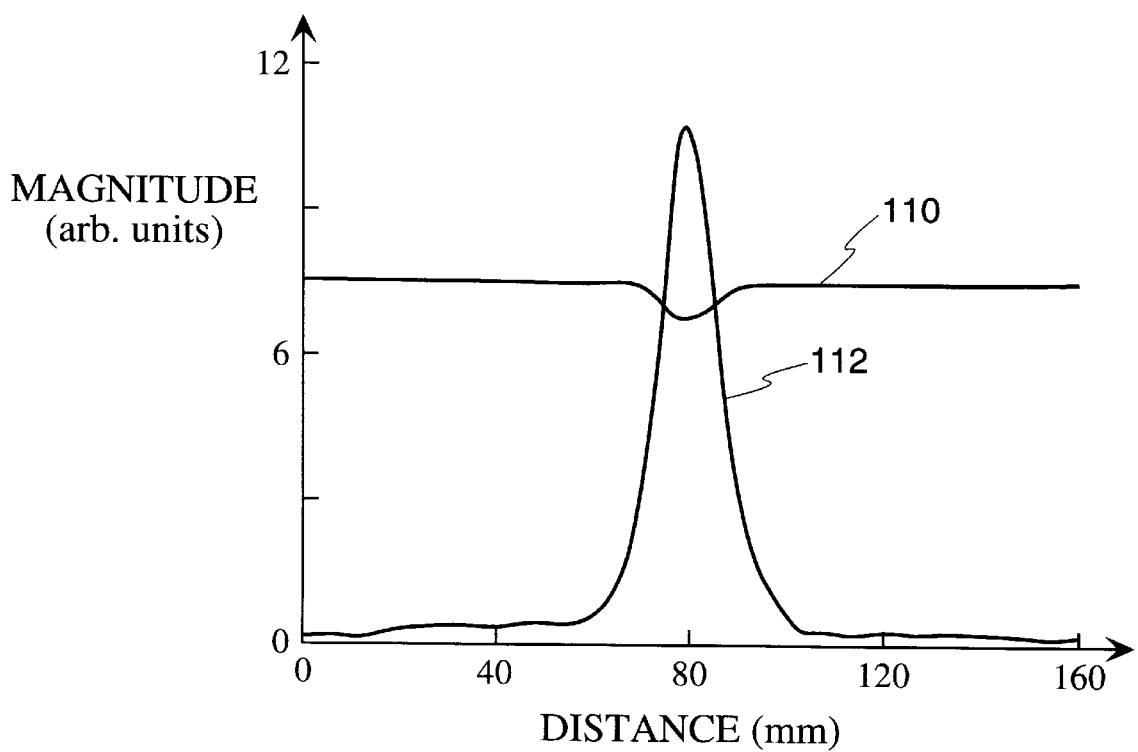
FIG. 11 is a graph of experimental results obtained with the cross-slit probe of the invention.

The effectiveness of this technique was tested by mapping a 120 μm-wide straight scratch in a 100 nm-thick film of silver deposited on a glass substrate. The mapping included a linear scan perpendicularly across the scratch with the cross slit aligned at 45° with respect to the slit. As shown in the graph of FIG. 11 for the magnitudes of the reflected signals, the non-rotated polarization component 110 showed a relatively small dip at the location of the scratch, representing the average local material characteristic. The non-rotated component 110, which passes back through the same slit through which the probing radiation passes, can be equated with the capabilities of the microwave probe of our prior patent application. However, the rotated component 112, passing back through the cross slit, shows a much stronger peak at the scratch location and almost no signal above the uniform material located away from the scratch. The rotated component 112 is much more sensitive to the local discontinuity. These measurements were made with a slit having a slit width of about 300 μm so the resolution is limited by the probe.

The complete complex impedance tensor of Equation (2) can be measured by alternately launching x-polarized and y-polarized radiation and measuring the magnitude and phase of all reflected components. This can be accomplished using the probes 60, 76 of FIGS. 6 and 7 by alternately using one rectangular waveguide 80 and then the other 88 as the source of probing radiation. Alternatively, the sample can be rotated by 90° between the two measurements.

The invention can also rely upon the two lowest circular polarization modes, that is, the left-handed and right-handed modes. One mode probes the sample, and both reflected modes can be detected. The equipment is nearly the same as in the orthomode transducer of FIG. 7, but a circular polarizer is placed between the orthomode transducer and the portion of the circular waveguide 78 with the cross-slit 66 in order to excite only one circular polarization mode at the probe tip. By analyzing the polarization state of the radiation reflected from the sample, as can be done by techniques well known in microwave engineering, it is possible to obtain useful information about the sample, such as the local optical activity or Hall effect.

The circularly polarized microwave microscope offers advantages over the linearly polarized microscope when optical activity needs to be distinguished from inhomogeneities. With the linearly polarized microscope, both optical activity and an inhomogeneity change the linear polarization of radiation upon reflection. However, for circularly polarized radiation, an inhomogeneity does not change the polarization state. Only natural optical activity or the optical activity artificially produced by a magnetic field changes the circular polarization state.

The invention can also be used in the transmission mode. In one embodiment, a conventional antenna, such as a horn antenna or dielectric lens, irradiates one side of the sample with a rather wide beam of polarizedprobe is positionion. The cross-slit probe is positioned on the other side of the sample very close (in the near field) to the sample surface with the slits arranged preferentially parallel and perpendicular to the polarization direction of the incident radiation. Thereby, both polarizations of transmitted radiation can be separately measured. The transmission measurement is sensitive not only to the uppermost layer of the sample but also to the underlying layer constituting the bulk of the sample. This deep sensitivity is advantageous when mapping defects in a conductive or dielectric layer covered by another uniform conductive layer.

Although it is preferable that the cross-slit aperture includes two perpendicularly intersecting and otherwise equal slits, the invention can be used with somewhat different geometries. The two slits need not be of equal size since Equation (2) can be satisfied separately for each of the slits. The slits need not be perpendicular, and for some crystalline symmetries a non-perpendicular oblique orientation may better match the eigenmodes and interactions of the sample. The cross-slit can be formed in a tee shape, and the two slits do not even have to touch, but the slits need to be close enough that their near-field radiation fields in the sample overlap.

The invention thus provides a simple apparatus for characterizing and mapping polarization-sensitive electrical characteristics of a sample. The mapping can be done with a resolution much finer than the wavelength of the probing radiation. If there are strong gradients of the characteristics, as would arise for example with a defect, the polarization cross terms provide an even finer resolution. It is possible to simultaneously measure two components of the polarization-sensitive characteristics. Nonetheless, the apparatus is relatively simple, can be constructed of mostly commercially available parts, and does not require environmental enclosures.

What is claimed is:

1. A microwave microscope for characterizing a sample having a surface, comprising:
    a microwave source of radiation;
    a microwave waveguide receiving said radiation from said source on a first end and capable of conveying two modes of differing polarizations of said radiation;
    an aperture formed into a second end of said microwave waveguide and having two obliquely arranged slits formed therein, each having a respective first dimension nearly resonant with said microwave radiation and having a respective second dimension substantially smaller than said first dimension; and
    at least one microwave detector adapted to detect a respective one of said two polarization modes reflected from a sample positioned outside said aperture.

2. The microwave microscope of claim 1, wherein said microwave waveguide is sized to support only the two lowest modes of radiation from said microwave source.

3. The microwave microscope of claim 2, wherein said waveguide has a square cross section, whereby said two modes are degenerate.

4. The microwave microscope of claim 2, wherein said waveguide has a circular cross section.

5. The microwave microscope of claim 1, wherein said microwave detector is adapted to detect a magnitude and a phase of said respective one polarization mode relative to said microwave source.

6. The microwave microscope of claim 1, wherein said at least one microwave detector comprises two microwave detectors detecting respective ones of said polarization modes.

7. The microwave microscope of claim 1, wherein said slits are formed perpendicularly to each other.

8. The microwave microscope of claim 7, wherein said slits intersect each other.

9. The microwave microscope of claim 1, wherein said end is curved along a long direction of a first one of said slits.

10. The microwave microscope of claim 9, wherein said end is not curved along a long direction of a second one of said slits.

11. The microwave microscope of claim 9, wherein said end is curved along long directions of both of said slits.

12. The microwave microscope of claim 1, wherein a first one of slits is oriented to pass radiation from said microwave source and a second one of said slits is not.

13. A microwave microscope, comprising:
    a microwave waveguide capable of supporting two modes of microwave radiation of differing polarizations; and
    a probe tip coupled to an end of said waveguide and having formed within a conductive layer two obliquely arranged slits, each slit having a long dimension and a substantially smaller short dimension, said probe tip being positionable within a near field of said radiation next to a surface of a sample to be probed.

14. The microwave microscope of claim 13, further comprising measuring means for separately measuring said two polarization modes.

15. The microwave microscope of claim 13, further comprising a source of said radiation coupled to an end of said microwave waveguide away from said tip.

16. The microwave microscope of claim 13, further comprising a source of said radiation with an antenna positionable on a side of said sample opposite said probe tip.

17. The microwave microscope of claim 13, further comprising means for providing relative lateral movement between said probe tip and said sample.

18. A method of scanning a surface for its polarization sensitive electrical characteristics, comprising the steps of:
    positioning a metallic end of a microwave probe at a height above said surface to be characterized, said microwave probe comprising a microwave waveguide being terminated in said metallic end and said metallic end having forming therein two obliquely arranged slits, each slit having a long dimension substantially longer than said height and a short dimension substantially shorter than said long dimension; and scanning said microwave probe over said surface.

19. The method of claim 18, wherein said microwave waveguide is capable of supporting two modes of said radiation having orthogonal polarizations and further comprising separately measuring each of said modes emanating from said sample.

20. The method of claim 18, wherein each of said long directions are nearly resonant with said microwave radiation.

* * * * *